United States Patent
Lee et al.

[11] Patent Number: 5,956,604
[45] Date of Patent: Sep. 21, 1999

[54] OHMIC CONTACT TO GALLIUM ARSENIDE USING EPITAXIALLY DEPOSITED COBALT DIGERMANIDE

[75] Inventors: Sabrina L. Lee, Schenectady; Kevin E. Mello, Ballston Spa, both of N.Y.; Steven R. Soss, San Jose, Calif.; Toh-Ming Lu, Loudenville; Shyam P. Murarka, Clifton Park, both of N.Y.

[73] Assignee: The United States of America as represented by the Secretary of the Army, Washington, D.C.

[21] Appl. No.: 08/889,608

[22] Filed: Jul. 8, 1997

Related U.S. Application Data

[60] Provisional application No. 60/032,655, Dec. 9, 1996, and provisional application No. 60/022,541, Jul. 22, 1996.

[51] Int. Cl.⁶ .................................................. H01L 21/28
[52] U.S. Cl. .......................... 438/606; 438/559; 438/605
[58] Field of Search .................................. 438/605, 606, 438/559

[56] References Cited

U.S. PATENT DOCUMENTS

| | | | |
|---|---|---|---|
| 3,781,612 | 12/1973 | Llacer et al. ......................... | 317/234 R |
| 4,357,183 | 11/1982 | Fan et al. ............................. | 148/181 |
| 4,550,031 | 10/1985 | Abrokwah ............................ | 427/10 |
| 4,593,307 | 6/1986 | Rupprecht et al. .................. | 357/67 |
| 4,833,042 | 5/1989 | Waldrop et al. ..................... | 428/641 |
| 5,173,443 | 12/1992 | Biricik et al. ........................ | 438/72 |
| 5,770,485 | 6/1998 | Gardner et al. ..................... | 438/162 |
| 5,789,269 | 8/1998 | Mehta et al. ........................ | 438/439 |

Primary Examiner—Charles Bowers
Assistant Examiner—Reneé R. Berry
Attorney, Agent, or Firm—John F. Moran; Michael C. Sachs

[57] ABSTRACT

A partially ionized beam (PIB) deposition technique is used to heteroepitaxially deposit a thin film of $CoGe_2$ (001) on GaAs (100) substrates 14. The resulting epitaxial arrangement is $CoGe_2$ (001) GaAs (100). The best epitaxial layer is obtained with an ion energy 1100 eV to 1200 eV and with a substrate temperature of approximately 280° Centigrade. The substrate wafers are treated only by immersion in $HF:H_2O$ 1:10 immediately prior to deposition of the epitaxial layer. Contacts grown at these optimal conditions display ohmic behavior, while contacts grown at higher or lower substrate temperatures exhibit rectifying behavior. Epitaxial formation of a high melting point, low resistivity cobalt germanide phase results in the formation of a stable contact to n-GaAs.

15 Claims, 1 Drawing Sheet

OHMIC CONTACT TO GALLIUM ARSENIDE USING EPITAXIALLY DEPOSITED COBALT DIGERMANIDE

This application claims benefit of Provision Appln. 60/032,655 filed Dec. 9, 1996 and 60/022,541 filed Jul. 22, 1996.

UNITED STATES GOVERNMENT INTEREST

The invention described herein may be manufactured, used and licensed by or for the United States Government for United States Government purposes.

TECHNICAL FIELD

The present invention relates in general to low-temperature epitaxial growth of thin films. In particular, the present invention relates to the use of a partially ionized beam deposition of $CoGe_2$ (001) thin films, i.e. Cobalt Digermanide on GaAs (100) substrates i.e. Gallion Arsenide.

BACKGROUND ART

Contacts to n-GaAs doped-substrates resulting in either Ohmic or rectifying behavior are technologically important for use in electronic and optoelectronic devices and circuits. Ideally, an Ohmic contact should allow the required current with a voltage drop that is substantially small compared to the drop across the active region of the device, so as not to significantly disturb device operation. During fabrication of GaAs devices, annealing temperatures routinely reach about 400° C., and can be as high as 600–800° C. during solar cell and self-aligning device processing. A key issue in manufacturing such devices is producing thermally stable and reliable contacts.

For manufacturing contacts to n-GaAs doped substrates, no elemental metal offers a low Schottky barrier which would avoid undesirable rectifying behavior. The most commonly used Ohmic contact to n-GaAs material are systems based on the Au-Ge eutectic. When an Au-Ge film on GaAs doped material is heated to the eutectic temperature (356°), an Ohmic contact is formed. Au-Ge, however, does not easily wet GaAs. To promote wetting, small amounts of Ni (from 2–11 wt %) are added during deposition. Many other schemes of Ohmic contact formation have been conceived. However, most require metallurgical interaction with the GaAs (alloying) induced by a high temperature (often >400° C.) thermal anneal, a time-consuming process often resulting in undesirable contact morphology.

Other techniques, have been attempted without particular success. For example, sequential sputtering of Co and Ge followed by an anneal to produce Ge-rich Co-Ge contacts has been carried-out. However, the anneal step was shown to induce chemical interaction with the GaAs, and in most cases produces rectifying behavior for the contacts. The resulting product is entirely unsuitable as a contact in a semiconductor device.

In summary, the conventional art, in particular that using Au-Ge eutectic to make ohmic contact to GaAs, suffers from lack of temperature stability resulting in a lack of film/contact uniformity. The alloying process produces a non-uniform contact with the substrate. Further, undesirable interactions with the substrate occur, as well as other drawbacks illustrated.

SUMMARY OF THE INVENTION

One object of the present invention is the provision of uniform, stable Ohmic contacts to GaAs doped substrates, not currently available with the current conventional art.

Another object of the present invention is to provide a less expensive Ohmic contact.

A further object of the present invention is to provide an Ohmic contact that is able to endure high temperature post-processing due to inherent thermal stability of the contact.

Yet a further object of the present invention is to provide a stable ohmic contact that is useful in high-power devices.

Still an additional object of the present invention is to provide a low resistivity Ohmic contact to GaAs doped substrates.

These and other advantages of the present invention are realized through a process for forming a contact on a GaAs doped substrate without alloying. During the process a partially ionized beam is generated to include $Ge^+$ ions. At the next step energy at a level between 1100 eV and 1200 eV is applied to accelerate the $Ge^+$ ions to a substrate. Then, the substrate is heated in the range of 200° C.–380° C., thereby forming an epitaxial of $CoGe_2$ layer to serve as an electrical contact with the GaAs doped substrate.

DETAILED DESCRIPTION OF THE PREFERRED EMBODIMENTS

Figure 1:
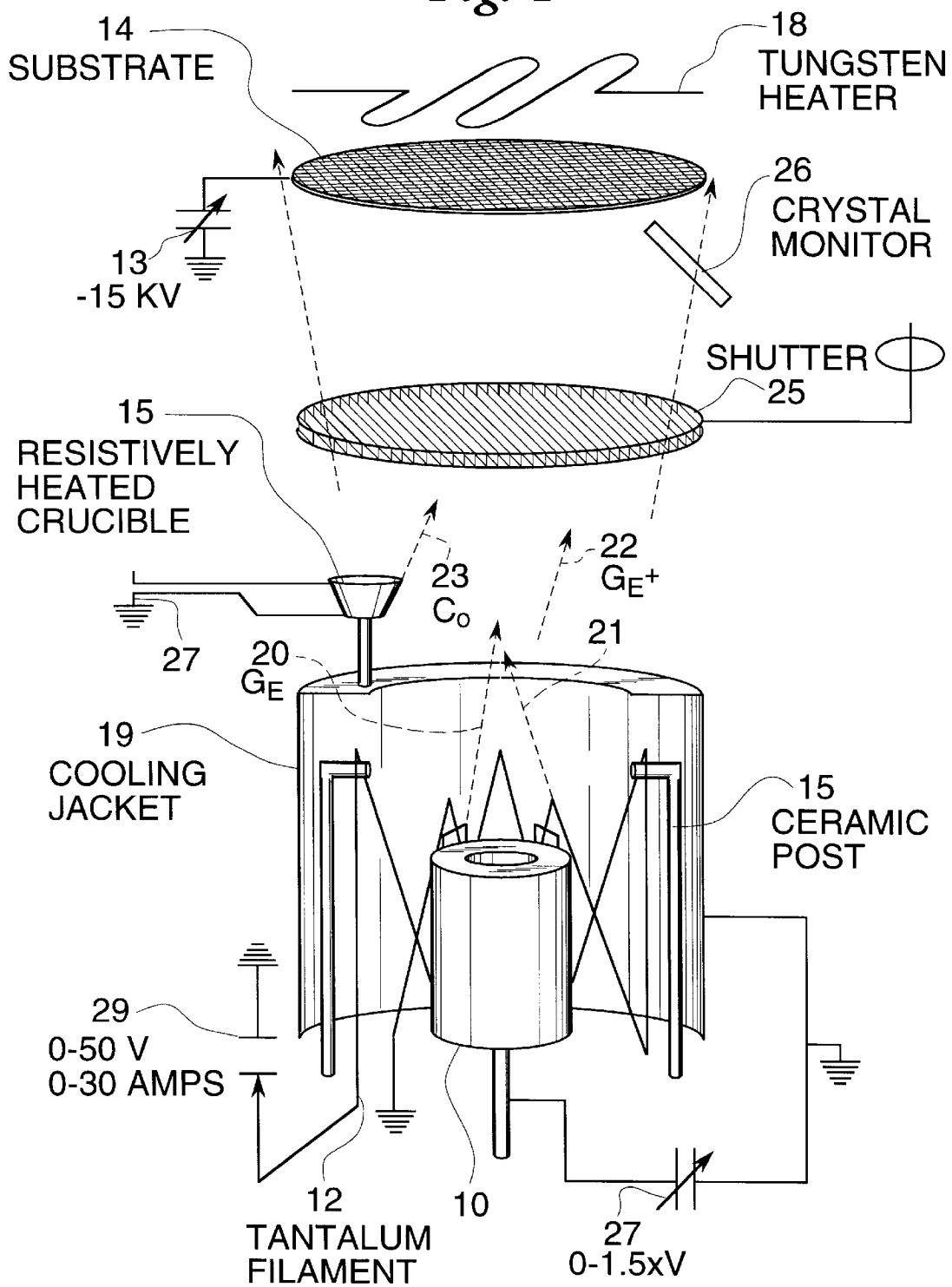
FIG. 1 is a perspective diagram depicting a device for using the process of the present invention.

The process of the present invention forms an epitaxial layer of a cobalt germanide, $CoGe_2$ on GaAs to form the heteropitaxial system of $CoGe_2$, (001)/GaAs (100). This phase offers a low lattice mismatch (–0.2%) with GaAs, and has been shown in bulk form to be the minimum resistivity phase of all the cobalt germanides with a polycrystalline resistivity of 3.5 $\mu\Omega$-cm., a value comparable to that of $CoSi_2$, and has a high melting temperature (806° C.). Therefore, single-crystal contacts of this phase can provide excellent high-temperature thermal stability.

The inventive process is carried out by modifying the conventional partially ionized beam (PIB) deposition operation as depicted in FIG. 1. The PIB process facilitates use with the present invention because of certain characteristics of the PIB process described below.

Conventionally, in the formation of heteropitaxial layers, one must start with a clean surface free of native oxides and contaminants, so that the arriving evaporant atoms "see" clearly the periodic potential of the substrate. To achieve such a perfect surface, in-situ cleaning is necessary. In-situ cleaning typically consists of either sputtering clean the surface with Ar or Xe ions of several kV, and subsequently annealing out the surface damage, or heating the substrate to the point where impurities are desorbed. With Si these techniques work well. However, GaAs, being a binary compound, suffers from preferential sputtering of surface atoms and differing vapor pressures of Ga and As. Therefore, both techniques lead to a non-nonstoichiometric surface. To achieve a perfect surface with GaAs, one must have an As overpressure while heating to desorb impurities, or a new layer of one 1:1 GaAs is grown in-situ after the substrate has been cleaned. Heteroepitaxial films must also be grown under high vacuum conditions, as the surface is quickly recontaminated if the pressure is greater that about $10^{-9}$ Torr.

The situation for PIB deposition is quite different. In this case, a small fraction of the evaporated species is ionized, typically <1%. By the application of a bias to the substrate one may obtain ion bombardment of first the semiconductor surface, and then the growth front of the growing film. One of the principal advantages of the PIB technology is the capability of depositing heteroepitaxial films at lower (than conventional) substrate temperatures in a conventional vacuum without in-situ cleaning of the substrate prior to deposition. In effect the PIB technique possesses a surface self-cleaning capability.

Also, for microelectronics applications, deriving the ions from the source material is preferred, since self-ions do not contaminate the film. Ions in the evaporant stream increase surface mobility, provide addition energy to the growth front, sputter away light impurities, and can control nucleation characteristics. The PIB deposition method exhibits the aforementioned characteristics, and thus, lends itself to use with the novel parameters of the present invention.

The PIB deposition system as depicted in FIG. 1 is used to deposit the alloy films on GaAs (100) substrates 14. The PIB system is equipped with a graphite crucible 10 surrounded by a Ta filament 12. Electrons in stream 21 are thermionically emitted from the powered Ta filament, and strike the graphite crucible 10 due to the application of a high positive voltage, typically ≈1200V. A portion of the electrons travel over the mouth of the crucible and impact ionize the exiting Ge vapor stream 20 (less than 1% and approximately 0.2%). These $Ge^+$ ions are then accelerated by a potential from source 13 applied to the substrate 14. The $Ge^+$ ions arrive at the growth front of substrate 14 with an energy given by the potential difference between the crucible and the substrate, and are deposited along with the neutral Ge species (from stream 20) and Co, (from stream 23) which is conventionally evaporated in a resistively, heated BN crucible 15, powered by electrical source 27. The deposition rates were selected such that the ratio of the Co to Ge atoms arriving at the substrate is 1:2.

Substrate preparation consists of a 30 second wet etch in $HF:H_2O$ 1:10, followed by drying in flowing $N_2$ gas. However, other substrate preparations can be used with the present invention. Immediately after the etch, the wafers were loaded into a processing chamber (not shown) for deposition. The interior of the chamber containing the substrate and other necessary elements for the deposition process (including shutters 25 crystal monitor 26 and heater 18) are also depicted in FIG. 1.

In the chamber a planar W heating filament 18 is positioned approximately 3 cm above the substrate 14 to heat the sample during deposition. The GaAs substrate is positioned under the W filament, was allowed 3 minutes to reach the correct temperature (optimally 280° C.) before starting an alloy deposition. The depositions proceeds under a vacuum of $\approx 5 \times 10^{-7}$ Torr, and the films are preferably grown to a thickness of 1500 Å. The system base pressure was $10^{-7}$ Torr.

The deposition is preferably carried out on n-type epi-ready GaAs (100) wafers. For electrical measurements, $4.42 \times 10^{-3}$ $cm^2$ dots are deposited through a shadow mask (not shown) onto Si doped GaAs (100) wafers with a carrier concentration of $(1-4) \times 10^{18}$ $cm^{-3}$.

The $Ge^+$ ions arrive at substrate 14 with an energy given by the potential drop between the crucible 10 and the substrate 14 and are deposited along with the neutral Ge species and the Co. In general the present invention can be practiced to grow epitaxial layers at an energy level range of ~1100 eV to 1200 eV. Since Co undergoes a magnetic transition at ~1100° C. it was found to be incompatible with PIB evaporation. Consequently, the Co must be heated in a resistively heated crucible 15. The deposition rates are preferably selected such that the ratio of the Co and Ge atoms arriving at the substrate was 1:2. The deposition rates for the Co and Ge are ~0.5 and 2.1 Å/s. respectively.

The temperature range of the heated substrate 14 varies from 200° C. to 380° C. for the inventive process. Analysis of the phase of the deposit showed that the $CoGe_2$ phase formed most readily at a substrate temperature of approximately 280° C. Consequently, this is one of the optimal parameters of the present invention. However, the present invention can be facilitated at other, less optimal temperatures in the aforementioned range. At very low substrate temperatures ($\leq 200°$ C.) only a small degree of crystallinity in the films were observed. In addition, at a substrate temperature of 390° C., the film was also found to possess little crystallinity.

The films deposited under ideal conditions of ~280° with 1100 eV $Ge^+$ ions display a very tight epitaxial structure with the substrate 14. Stereograms taken of the films and substrates formed by the inventive process are able to detect 4 GaAs (111) poles and 4 $CoGe_2$ (111) poles. The orientation and the angle of the poles for both the epitaxial layer and the substrate were found to coincide, thereby creating an extremely stable lattice configuration between the substrate and the epitaxial layer. The resulting product is a parallel epitaxial arrangement of $CoGe_2$ (001) /GaAs (100).

Current-voltage measurements were preformed on $4.42 \times 10^{-3}$ $cm^2$ contacts grown under the aforementioned conditions for epitaxial growth and the structure was found to exhibit Ohmic behavior. Contacts grown at substrate temperatures above or below the ideal substrate temperature range of approximately 260°–380° C. were found to be rectifying.

It has been discovered that films deposited at 280° C. with lower ions energies display a different, nonparallel epitaxial arrangement than that of the structure formed under the aforementioned optimum conditions. This same deficiencies are also found for those films deposited with a lower substrate temperature of 200° C. and an ion energy near 1100 eV. Lowering the substrate temperature or reducing ion energy both seem to produce a deteriorated final product. Apparently the stream of $Ge^+$ions 22 formed in the evaporant stream (22,23,24) increase the surface mobility, provide additional energy to the growth front, sputter away light impurities and also suppress three dimensional island growth by increasing the density of nucleation sites thus facilitating the high epitaxial growth that is the chief advantage of the present invention.

Atomic force microscopy (AFM) analysis of the products manufactured according to the inventive process shows that the surface of the epitaxially grown films are rough, with a root mean square roughness of 400 Å for a 1500-Å-thick film. It is possible that preferential faceting is responsible for the roughness. However, the film is found to be continuous with no observable grain boundaries. Based upon the high intensity of the $CoGe_2$ (004) and (008) peaks in a 2θ scan of the final product and the fact that the (111) poles in the stereogram are remarkably tight (as narrow as the substrate poles), the resulting epitaxial film is found to be almost completely a single crystalline structure.

Using the PIB system as modified by the parameters of the present invention, epitaxial $CoGe_2$ is a viable alternative to the metallization of n-GaAs. Although a number of preferred embodiment of this invention has been mentioned by way of example, it is not intended that the invention be limited thereto. Accordingly, the invention should be considered to include any and all configurations, modifications, variations, combinations, equivalent arrangements or expansions falling within the scope of the following claims.

What is claimed:

1. A process for forming $CoGe_2$ electrical contacts on a GaAs doped substrate (14), comprising the steps of:

(a) generating a partially ionized beam (20, 22, 23) including $Ge^+$ ions (22);

(b) applying energy in a range of 1100 eV through 1200 eV to said $Ge^+$ ions; thereby accelerating said partially ionized beam to a GaAs doped substrate upon which electrical contacts are to be formed;

(c) generating a stream of Co and directing the stream to the GaAs doped substrate;

(d) heating said substrate to a temperature between 200° C. through 380° C.;

(e) simultaneously to step (d) creating a vacuum around said substrate to a level of approximately $5 \times 10^{-7}$ Torr.

2. The process of claim 1, wherein step (c) is carried out by heating said substrate to substantially 280° C.

3. The process of claim 2, wherein step (c) is carried out for a duration of approximately 3 minutes.

4. The process of claim 1, wherein step (b) is carried out by applying substantially 1100 eV to said $Ge^+$ ions (22).

5. The process of claim 1, wherein step (a) comprises the substep of:

(i) evaporating Ge (20).

6. The process of claim 5, wherein substep (i) is carried out in a graphite crucible.

7. The process of claim 5, wherein step (a) further comprises a substep of:

(ii) generating electrons (21) by thermionic emission.

8. The process of claim 7, wherein said electrons (21) are emitted by heating a Ta filament (18) above the thermionic emission temperature.

9. The process of claim 8, wherein said $Ge^+$ ions (22) are generated by impacting said electrons against said evaporated Ge (20).

10. The process of claim 7, wherein substep (iii) is carried out in a resistively heated crucible (16).

11. The process of claim 1, further comprising the preliminary step of washing said substrate in a solution of $HF:H_2O$ at a 1:10 ratio prior to step (a).

12. The process of claim 1, wherein said partially ionized beam (20,22,23) includes Co and Ge in a ratio of 1:2.

13. The process of claim 11, wherein prior to said step of washing said substrate is implanted with Si at a level in the range of $(1-4) \times 10^{18}$ $cm^3$.

14. A process for forming $CoGe_2$ electrical contacts on a GaAs doped substrate comprising the steps of:

(a) generating a partially ionized beam including $Ge^+$ ions;

(b) generating a stream of cobalt;

directing said ionized beam and said stream of cobalt to a GaAs doped substrate under conditions such that said $Ge^+$ ions and said stream of cobalt form $CoGe_2$ electrical contacts on the substrate.

15. The process of claim 14 wherein the substrate is a silicon doped GaAs substrate.

* * * * *